(12) United States Patent
Schaeffer et al.

(10) Patent No.: US 6,924,653 B2
(45) Date of Patent: Aug. 2, 2005

(54) SELECTIVELY CONFIGURABLE MICROELECTRONIC PROBES

(75) Inventors: Ralph Schaeffer, Boise, ID (US); Brett Crump, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/228,116

(22) Filed: Aug. 26, 2002

(65) Prior Publication Data

US 2004/0036490 A1 Feb. 26, 2004

(51) Int. Cl.$^7$ ............................................. G01R 31/02
(52) U.S. Cl. ........................................ 324/754; 324/762
(58) Field of Search ................................ 324/754–762, 324/72.5; 439/482; 250/306–307

(56) References Cited

U.S. PATENT DOCUMENTS

| | | | |
|---|---|---|---|
| 3,806,801 A | 4/1974 | Bove | 324/72.5 |
| 4,757,256 A | 7/1988 | Whann et al. | |
| 4,892,122 A | 1/1990 | Ickes | 140/123 |
| 5,036,271 A | 7/1991 | Mazur et al. | 324/158 |
| 5,122,739 A | 6/1992 | Aton | |
| 5,214,389 A * | 5/1993 | Cao et al. | 324/719 |
| 5,229,679 A | 7/1993 | Higuchi et al. | 310/328 |
| 5,244,534 A | 9/1993 | Yu et al. | 156/636 |
| 5,314,843 A | 5/1994 | Yu et al. | 437/225 |
| 5,357,192 A | 10/1994 | Van Zee et al. | |
| 5,449,314 A | 9/1995 | Meikle et al. | 451/41 |
| 5,449,909 A * | 9/1995 | Kaiser et al. | 250/336.1 |
| 5,681,423 A | 10/1997 | Sandhu et al. | 156/636.1 |
| 5,739,050 A | 4/1998 | Farnworth | 438/15 |
| 5,786,621 A | 7/1998 | Saif et al. | 257/415 |
| 5,815,000 A | 9/1998 | Farnworth et al. | 324/755 |
| 5,883,519 A * | 3/1999 | Kennedy | 324/761 |
| 5,894,218 A | 4/1999 | Farnworth et al. | 324/158.1 |
| 5,923,178 A | 7/1999 | Higgins et al. | |
| 6,018,249 A | 1/2000 | Akram et al. | 324/758 |
| 6,025,728 A | 2/2000 | Hembree et al. | 324/755 |

(Continued)

FOREIGN PATENT DOCUMENTS

| | | |
|---|---|---|
| WO | WO 84/01437 A1 | 4/1994 |
| WO | WO 01/13130 A1 | 2/2001 |
| WO | WO 01/20347 A1 | 3/2001 |
| WO | WO 01/67116 A2 | 9/2001 |
| WO | WO 01/67116 A3 | 2/2002 |

OTHER PUBLICATIONS

Accuprobe, Inc., Z–Adjustable Probes for Wafer Sort and Hybrid Laser Trim, http://www.accuprobe.com/ . . . (accessed Jun. 27, 2002), 5 pages, Copyright 1996–2002, Salem, Massachusetts.

(Continued)

*Primary Examiner*—Vinh P. Nguyen
(74) *Attorney, Agent, or Firm*—Perkins Coie LLP

(57) ABSTRACT

Microelectronic components are commonly tested with probe cards. Certain aspects of the invention provide alternative probes, probe cards, and methods-of testing microelectronic components. In one specific example, a probe card includes a base and a probe carried by the base. An actuator is associated with the probe and is adapted to selectively position the probe with respect to an electrical contact on the microelectronic component. A test power circuit is coupled to the first probe and adapted to deliver test power to the first probe. In one exemplary method, a microelectronic component is tested by contacting each of a plurality of second probes carried by the probe card to one of a plurality of spaced-apart second contacts on the microelectronic component, thereby aligning each of the first probes with a first contact of the microelectronic component. The second probes may then be moved out of contact with the second contacts while keeping the base of the probe card stationary with respect to the microelectronic component.

42 Claims, 10 Drawing Sheets

U.S. PATENT DOCUMENTS

| | | | |
|---|---|---|---|
| 6,072,323 A | 6/2000 | Hembree et al. | 324/755 |
| 6,078,186 A | 6/2000 | Hembree et al. | 324/755 |
| 6,081,429 A | 6/2000 | Barrett | 361/767 |
| 6,094,058 A | 7/2000 | Hembree et al. | 324/755 |
| 6,106,351 A | 8/2000 | Raina et al. | 445/24 |
| 6,107,122 A | 8/2000 | Wood et al. | 438/117 |
| 6,150,717 A | 11/2000 | Wood et al. | 257/738 |
| 6,163,956 A | 12/2000 | Corisis | 29/832 |
| 6,180,525 B1 | 1/2001 | Morgan | 438/692 |
| 6,188,232 B1 | 2/2001 | Akram et al. | 324/755 |
| 6,198,172 B1 | 3/2001 | King et al. | 257/797 |
| 6,208,156 B1 | 3/2001 | Hembree | 324/755 |
| 6,247,629 B1 | 6/2001 | Jacobson et al. | 228/4.5 |
| 6,255,833 B1 | 7/2001 | Akram et al. | 324/755 |
| 6,257,958 B1 | 7/2001 | Angell et al. | 451/9 |
| 6,285,204 B1 | 9/2001 | Farnworth | 324/757 |
| 6,294,839 B1 | 9/2001 | Mess et al. | 257/777 |
| 6,310,484 B1 | 10/2001 | Akram et al. | 324/754 |
| 6,356,098 B1 | 3/2002 | Akram et al. | 324/765 |

OTHER PUBLICATIONS

Conrad, James M. and Mills, Jonathan W., "Appendix D: Technical Characteristics of Flexinol Actuator Wires," (Dynalloy, Inc.), *Stiquito™: Advanced Experiments with a Simple and Inexpensive Robot,* pp. 301–309, Dec. 1997, IEEE Computer Society Press and John Wiley & Sons, Inc., Los Alamitos, California and Somerset, New Jersey.

Kulicke & Soffa Industries Inc., Ceramic Blades—Probes, http://www.kns.com/prodserv/PDFS/TEST/probecard_blades.pdf, 4 pages. 2001.

Kulicke & Soffa Industries Inc., PCS 600 Probe Cards, http://www.kns.com/prodserv/test–division/pdfs/PCS600.pdf, 2 pages, 2001.

Kulicke & Soffa Industries Inc., Standard Epoxy Cantilever Probe Cards, http://www.kns.com/prodserv/pdfs/test/cantilever.pdf, 4 pages, 2001.

* cited by examiner

SELECTIVELY CONFIGURABLE MICROELECTRONIC PROBES

BACKGROUND

The present invention provides certain improvements in microelectronic component testing. More particularly, the present invention provides probes and probe cards of the type which may be used in testing microelectronic components (e.g., microelectronic components on semiconductor wafers prior to singulation, individual integrated circuit dies, or packaged components). These probes and probe cards are not limited to microelectronic component testing, though, and have utility in a variety of other testing applications, as well.

The microelectronics industry is highly competitive and most microelectronics manufacturers are highly sensitive to quality and cost considerations. Most microelectronics manufacturers require that suppliers of microelectronic components test performance of each microelectronic component before shipment to minimize the manufacturer's product loses. Microelectronics are commonly tested by establishing temporary electrical connections between a test system and electrical contacts on the microelectronic component.

One way of establishing a temporary electrical connection between the test system and the contacts on the component employs a probe card carrying plurality of cantilevered wire probes. Such wire probes employ a relatively stiff wire tip at the end of an elongate arm. A plurality of these cantilevered wire probes are connected to a probe card and arranged in a predetermined array adapted for use with a specific microelectronic component configuration. The cantilevered wire probes may be attached to the probe card using an epoxy ring or the like. Alternatively, some commercially available systems employ exchangeable probes which allow each of the cantilevered wire probes to be removed from the probe card for repair or replacement.

Another common way to temporarily electrically connect a microelectronic component to a test system employs a probe card with rigid contacts. These contacts may be adapted to rigidly abut the component's contacts, e.g., a bond pad of an unbumped chip or wafer or solder balls on a bumped chip or wafer. These rigid contacts are arranged in an array which matches with the array of contacts on the microelectronic component to be tested.

When testing a microelectronic component with a conventional probe card (whether it be a cantilevered wire probe card, a rigid contact probe card, or another design), the probe card is positioned proximate the microelectronic component to be tested. The probe card and the microelectronic component are typically optically aligned with one another in an effort to precisely align each of the contacts or probes of the probe card with an electrical contact of the microelectronic component. The probes or the body of the probe card can interfere with a clear view of the microelectronic component contacts. As a result, it can be difficult to accurately align all of the test probes with the component contacts. The probes closest to the point(s) of visual alignment may be close to the target contact on the microelectronic component. Unfortunately, probes farther away from the point(s) of optical alignment can be displaced from their intended positions, leading to insufficient contact with some of the component contacts.

In some applications, it is necessary to test parametric contacts on a wafer with test probes to measure the quality of a semiconductor wafer at various stages of manufacture. The parametric contacts are commonly positioned in "streets" between adjacent dies on the wafer. Some of the parametric contacts will be aligned along a street extending in an X-direction while other parametric contacts may be aligned along a street which extends in a generally perpendicular Y-direction. Testing these different sets of parametric contacts can be problematic because the arrangement of the dies and the contact may vary from one wafer to another. One approach used to address the variations in geometry from one wafer to another is to create a custom probe card for each wafer design. This can become fairly expensive, though, particularly for manufacturers that produce a number of specialty products in small runs. Another approach to address this problem employs a single probe card adapted for use with a single set of parametric contacts that are arranged along a single street or a single set of parallel streets. After the wafer is tested using this probe card, the wafer can be turned 90 degrees and the same probe card can be used to contact a second set of parametric contacts positioned in a perpendicular street. This may avoid the cost of manufacturing as many custom probe cards, but moving the wafer with respect to the probe cards and carefully realigning the probes with respect to the second set of parametric contacts is fairly time consuming, reducing throughput of the testing equipment.

For some applications, microelectronic components must be tested at different temperatures, such as in burn-in testing. When the microelectronic component under test changes temperature, it may expand or contract. The probe card and its associated probes may expand or contract at a rate which differs from the rate of expansion or contraction of the microelectronic component. As a consequence, many manufacturers must create two or more different probe cards for a single microelectronic component configuration, with each probe card being configured to accurately position the probes for contacting the component contacts at a particular temperature or narrow range of temperatures. Again, manufacturing multiple custom probe cards can be relatively expensive and can hamper efficient production of custom microelectronic components in small production runs.

DETAILED DESCRIPTION

A. Overview

Figure 1:
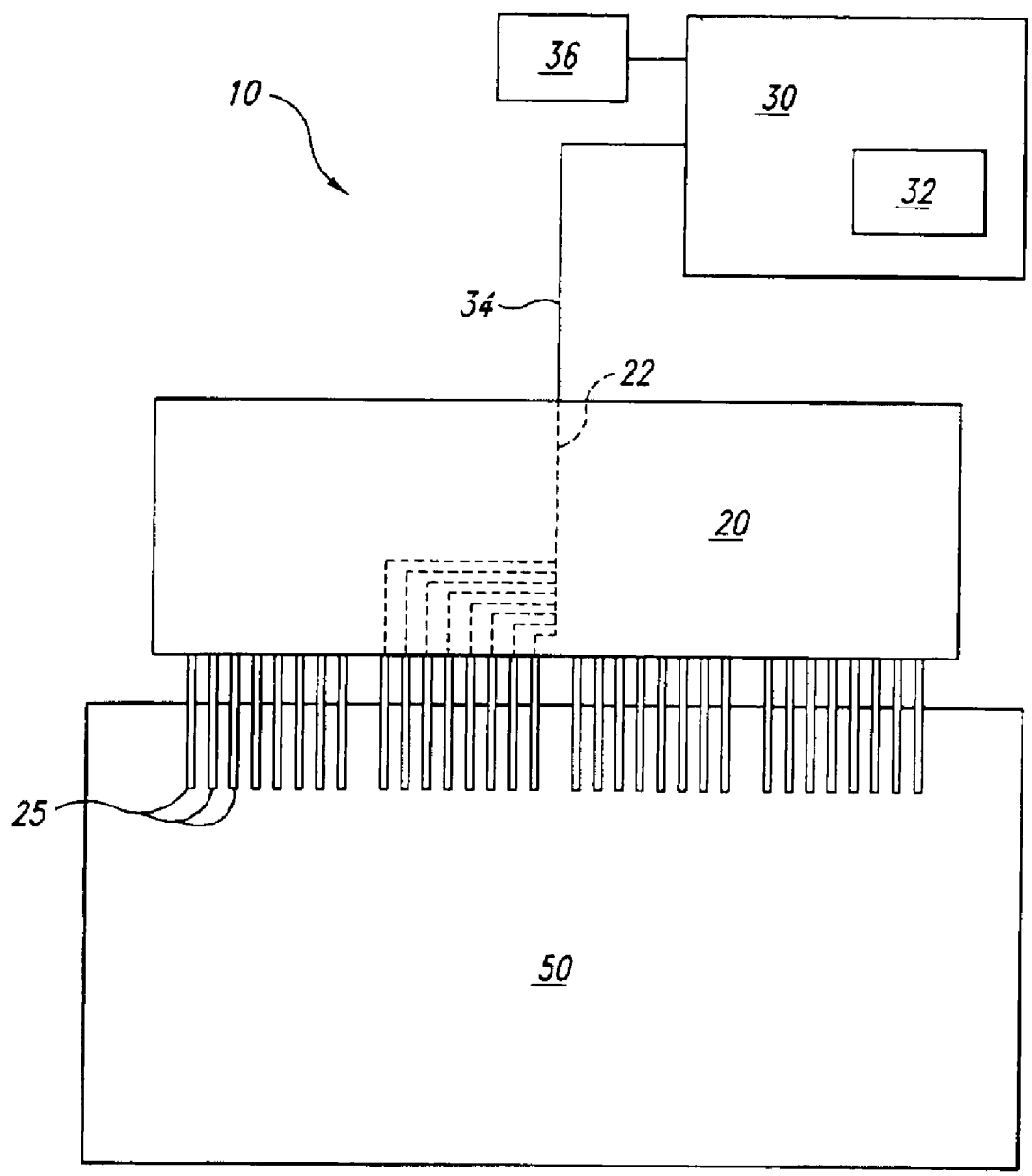
FIG. 1 is a schematic illustration of a microelectronic component test system of an embodiment of the invention.

Various embodiments of the present invention provide methods and apparatus for testing microelectronic components. Unless the specific context clearly requires otherwise, throughout the description and claims, the terms "microelectronic component" and "microelectronic component assembly" may encompass a variety of articles of manufacture, including, e.g., semiconductor wafers having active components, individual integrated circuit dies, packaged dies, and subassemblies consisting of two or more microelectronic components, e.g., a stacked die package. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

In one embodiment, the present invention provides a probe card adapted to test a microelectronic component. This probe card includes a base, a first probe carried by the base, a first actuator, and a test power circuit. The first actuator is associated with the first probe and is adapted to selectively position the first probe with respect to a first electrical contact on the microelectronic component. The test power circuit is coupled to the first probe and is adapted to deliver test power to the first probe.

Another embodiment of the invention provides a probe card which is adapted to test a microelectronic component and includes a base and a first probe carried by the base. The probe card also includes a first actuator means for selectively moving the first probe with respect to a first electrical contact on a microelectronic component. The probe card may also include a test power means for delivering test power to the first probe.

Another embodiment provides a probe card which includes a base, a first probe carried by the base, and a second probe carried by the base. The first probe has a tip adapted to deliver test power to a first electrical contact on a microelectronic component. The second probe is selectively movable from a first position, wherein a tip of the second probe is positioned in a plane of the first probe tip, and a second position, wherein the second probe tip is spaced from the plane of the first probe tip.

A probe card in accordance with another embodiment of the invention includes a plurality of probes carried by a base and a plurality of actuators. Each actuator is associated with one of the probes. The actuators are adapted to move the probes from a first relative orientation corresponding to positions of contacts on a microelectronic component at a first temperature to a second relative orientation corresponding to positions of the contacts at a different second temperature.

A microelectronic component test system in another embodiment of the invention includes a probe card and a controller. The probe card includes a plurality of first probes and a plurality of second probes. Each of the first probes is adapted to selectively engage or disengage one of a plurality of first contacts on the microelectronic component. Each of the second probes is adapted to be coupled to one of a plurality of second contacts on the microelectronic component. If so desired, each of the second probes may be adapted to selectively engage or disengage a corresponding one of the second contacts. The controller is in communication with the probe card and is adapted to cause the first probes to disengage the first contacts and to direct a test signal to the second contacts through the second probes while the first probes are disengaged from the first contacts.

In an alternative application, a microelectronic component test system includes a probe card and a controller in communication with the probe card. The probe card includes a plurality of first relays, each of which is adapted to move between a closed condition and an open condition. Each first relay in its closed condition electrically engages one of a plurality of first contacts on the microelectronic component and each first relay in its open condition is electrically disengaged from that first contact. The probe card also includes a plurality of probes, each of which is adapted to be coupled to one of a plurality of second contacts on the microelectronic component. The controller is adapted to move the first relays to their open condition and to direct a test signal to the second contacts through the probes while the first relays are disengaged from the first contacts.

Yet another embodiment provides a method of testing a microelectronic component with a plurality of first probes carried on a base of a probe card. In accordance with this method, each of the plurality of second probes carried by the probe card are contacted to one of a plurality of spaced-apart second contacts on the microelectronic component, thereby aligning each of the first probes with a first contact of the microelectronic component. The second probes may be moved out of contact with the second contacts while keeping the base of the probe card stationary with respect to the microelectronic component. If so desired, test power may be delivered to the first contacts with the first probes while the second probes are out of contact with the second contacts.

In an alternative method, a microelectronic component having a plurality of first contacts arranged in a first direction and a plurality of second contacts arranged in a different second direction is tested. This may be accomplished by positioning a base of a probe card relative to the microelectronic component to position each of a plurality of first probes of the probe card relative to one of the first contacts and to simultaneously position each of a plurality of second contacts of the probe card relative to one of the second contacts. Test power is delivered to the first contacts with the first probes. The first probes are moved out of electrical contact with the first contacts while keeping the base of the probe card stationary with respect to the microelectronic component. Test power is delivered to the second contacts with the second probes.

Still another method in accordance with a different embodiment of the invention tests a microelectronic component with a selectively configurable probe card. In this method, each of a plurality of contacts carried by the microelectronic component are contacted at a first temperature with one of a plurality of probes carried by the probe card, the probes being arranged in a first probe arrangement. The temperature of the microelectronic component is changed, thereby altering a relative arrangement of the contacts from a first contact arrangement to a different second contact arrangement. A plurality of actuators are actuated to rearrange the probes to a second probe arrangement wherein each of the probes is positioned to correspond to a position of one of the contacts in the second contact arrangement.

B. Probe Systems

FIG. 1 schematically illustrates a microelectronic component test system 10 that may be used to test a microelectronic component 50. The microelectronic component test system 10 generally includes a probe card 20 that is connected to a controller 30. The probe card 20 includes a plurality of probes 25 that may be positioned to contact electrical contacts (not shown) on the microelectronic component 50. The probes 25 may be connected to circuitry (schematically illustrated in dashed lines 22) in communication with each of the probes and adapted to deliver test power to one or more of the probes 25.

The controller 30 may communicate with the circuitry 22 of the probe card 20 by a communication line 34. The controller 30 may take any of a variety of forms. In one embodiment, the controller 30 comprises a computer having a programmable processor 32. The controller 30 may be operatively coupled to a power supply 36 and control delivery of power from the power supply 36 to various components of the probe card 20 via communication line 34. In one embodiment, a single power supply 36 may be used to deliver test power to the probes 25 and deliver actuation power to a plurality of actuators carried by the probe card 20, as detailed below. It should be understood, though, that two or more separate power supplies might be used instead. These multiple power supplies may be under the control of the same controller 30. In another embodiment, the probe card 20 may include an amplifier, e.g., a bipolar operational amplifier (not shown). In ordinary operation, the probe card 20 may be operatively connected to a power supply 36 having sufficient power to operate all aspects of the probe card. If the probe card is to be used in conjunction with a less powerful power supply, e.g., in the context of testing or repairing the probe card, having such amplifiers on the probe card 20 can amplify the power applied to the probes or other components of the probe card (such as the actuators discussed below).

As explained more fully below, some embodiments of the invention provide selectively configurable probe cards that include one or more selectively positionable probes 25. In some embodiments, the probes 25 can be moved away from a plane of the microelectronic component 50, e.g., to break or establish contact with electrical contacts carried by the microelectronic component 50. In such embodiments, each of the moveable probes 25 may function as a relay moveable between a closed position, wherein it is coupled to a component electrical contact, and an open position wherein it is electrically disengaged from that electrical contact. In other applications, it may be useful to move one or more of the probes 25 laterally with respect to the microelectronic component 50, e.g., without substantially changing the distance between the probe 25 and the plane of the microelectronic component 50. The following discussion focuses first on embodiments illustrated in FIGS. 2–9, which illustrate probes that may be moved toward or away from the plane of the microelectronic component 50. Next, embodiments that facilitate lateral movement with respect to the microelectronic component 50 are discussed in connection with FIGS. 10–14. Finally, several exemplary methods in accordance with other embodiments of the invention are described.

C. Probes Moveable in the Z-Axis

Figure 2:
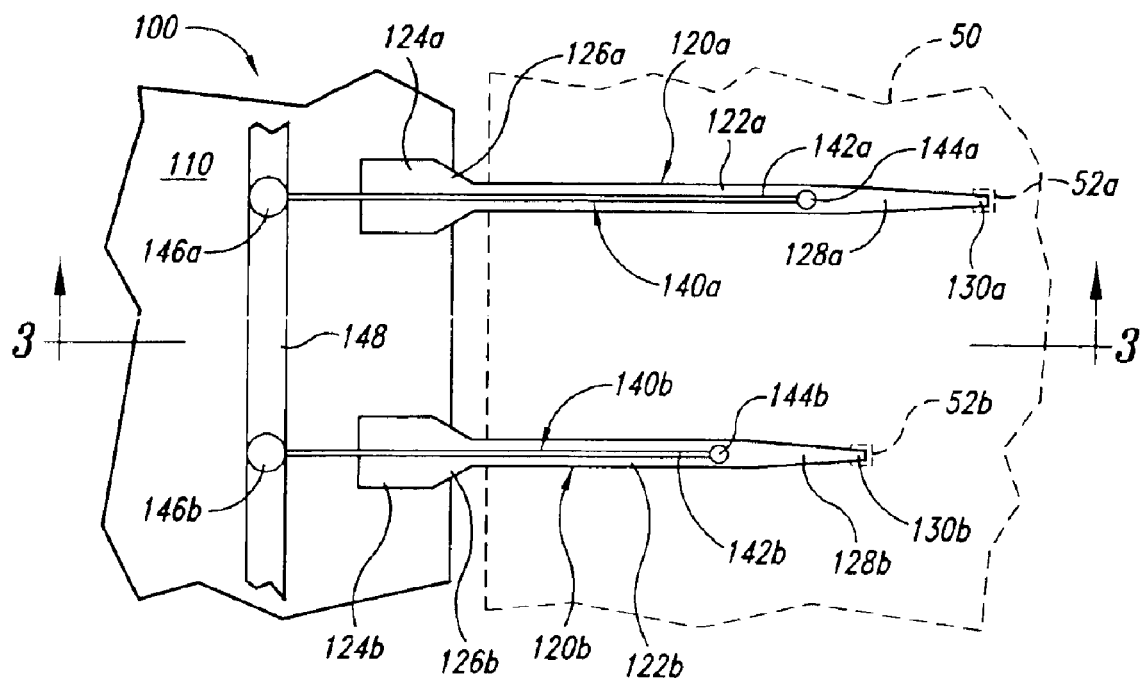
FIG. 2 is a schematic top view of a portion of a probe card in accordance with one embodiment of the invention.
Figure 3:
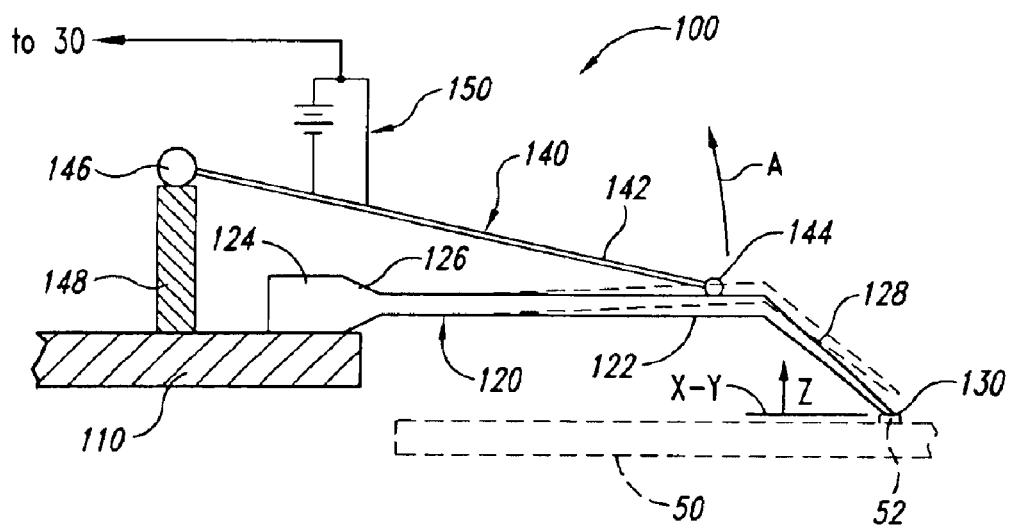
FIG. 3 is a schematic cross-sectional view taken along line 3—3 in FIG. 2.

FIGS. 2 and 3 illustrate a portion of a probe card 100 in accordance with one embodiment of the invention. This probe card 100 includes a plurality of probes 120 that are selectively movable in a Z direction (illustrated as arrow Z in FIG. 3) away from an X-Y plane (designated X-Y in FIG. 3) associated with the electrical contacts 52 of the microelectronic component 50.

The probe card 100 includes a base 110 that carries the probes 120. The base 110 may be formed of any suitable material. In one embodiment, the base 110 comprises a printed circuit board ("PCB") which includes circuitry (22 in FIG. 1) connected to one or more of the probes 120. In one embodiment, the base 110 includes circuitry adapted to deliver test power to each of the probes 120, communicate signals from the probes 120 back to the controller (30 in FIG. 1), and control actuation of actuators 140 associated with the probes 120, as discussed below.

FIG. 2 is a broken-away isolation view of a portion of the probe card 100 that includes only two probes 120a and 120b. It should be understood, though, that the base 110 may carry any number of probes 120. The number of probes will depend on the particular application. Standard epoxy cantilever probe cards known in the art, for example, can employ literally thousands of probes to test multiple devices under test.

In the embodiment illustrated in FIGS. 2–3, both of the probes 120 are cantilevered wire probes that extend beyond the edge 112 of the base 110. The first probe 120a includes an elongate flexible body 122a extending outwardly from an anchor 124a attached to the base 110. If so desired, the first probe 120a may include a taper 126a between the anchor 124a and the body 122a. A distal length 128a of the probe 120a may taper in diameter and be angled toward the microelectronic component 50, i.e., downwardly in the orientation of FIG. 3. A first probe tip 130a of the probe 120a may contact a first electrical contact 52a of the microelectronic component 50. Similarly, the second probe 120b includes an anchor 124b attached to the base 110, a taper 126b between the anchor 124b and the body 122b, and a distally tapering distal length 128b terminating in a second probe tip 130b. This second probe tip 130b is positioned proximate to, and in some circumstances may be in electrical contact with, a second electrical contact 52b on the microelectronic component 50.

In some embodiments, all of the probes 120 may have substantially the same length. In the embodiment of FIG. 2, though, the first probe 120a is longer than the second probe 120b. In both circumstances, though, the probe length is selected to position the probe tip 130 proximate a particular electrical contact 52 on the microelectronic component 50 when the probe card base 110 is positioned adjacent the microelectronic component 50.

The probes 120 may be formed of any suitable material. In one embodiment, the probes 120 are formed of a flexible, electrically conductive metal suitable to deliver test power to the contacts 52 of the microelectronic component 50 during testing. By way of non-limiting example, these probes 120 may comprise tungsten, tungsten-rhenium alloys, beryllium-copper alloys, or gold-plated beryllium-copper alloys.

Each of the probes 120 of FIG. 2 is associated with an actuator 140. The actuator 140a includes a flexor 142a that is bonded by a first bond 144a to the body 122a of the first probe 120a. The other end of the flexor 142a is attached to a second bond 146a which may couple the flexor 142a to an upstanding support 148 which extends outwardly away from the base 110 in the direction of the Z-axis (FIG. 3). Similarly, the second actuator 140b includes a flexor 142b joined adjacent one end by a first bond 144b to the probe 120b and joined at its other end by a second bond 146b to the support 148. (For clarity and ease of understanding, the letters differentiating the first actuator 140a from the second actuator 140b have been omitted in FIG. 3.)

The flexor 142 is adapted to change length in response to a selected stimulus. For example, the flexor 142 may change length in response to a voltage applied by an actuator power supply 150 under control of the controller 30 (FIG. 1). Any of a variety of materials or structures may serve this purpose. For example, the flexor 142 may comprise a piezoelectric element that can be contracted or elongated by structured alternation of an electrical field applied to the element. Such piezoelectric elements are discussed, for example, in U.S. Pat. No. 5,229,679 and International Publication No. WO 01/20347, the entirety of each of which is incorporated herein by reference.

In another embodiment, the flexor 142 comprises a shape memory material that can change length upon heating or cooling. A variety of such shape memory materials are known in the art, including both metallic alloys and organic materials. One such material that has been studied fairly extensively and is commercially available in a number of forms is nitinol, a super elastic nickel-titanium alloy. These alloys undergo a crystallographic phase change when heated above or cooled below a transition temperature. One nitinol alloy expected to be suitable for the flexors 142 is commercially available under the trade name FLEXINOL from Dynalloy, Inc., in Costa Mesa, Calif., USA.

The first bond 144 joins the flexor 142 to the probe 120 in a first location and the second bond 146 attaches the other end of the flexor 142 to the vertical support 148 at a second location. The first location is closer to the X-Y plane associated with the contacts 52 than is the second location. As a consequence, when the flexor 142 shortens, it will tend to move the distal length 128 of the probe 120 away from the X-Y plane (i.e., upwardly in FIG. 3), as indicated by the arrow A. Hence, the probe 120 may move from a first position (shown in solid lines), wherein the probe tip 130 electrically contacts the contact 52 of the microelectronic component 50, to a second position (shown in phantom lines in FIG. 3) wherein the distal tip 130 is spaced from the contact 52. Hence, the actuator 140 enables the probe 120 to be selectively electrically coupled with or electrically disconnected from the microelectronic component 50.

The probe 120 and actuator 140 may comprise a relay which is moveable between an open condition and a closed condition by selective activation of the actuator 140. In the relay's closed condition (shown in solid lines in FIG. 3), the probe tip 130 electrically engages the contact 52. By activating the actuator 140 and shortening the flexor 142, the relay will move to its open condition wherein the probe tip 130 is spaced from and electrically disengaged from the contact 52.

The power supply 150 is schematically illustrated as a DC power supply. If so desired, the power supply 150 may instead be an AC power supply (e.g., as schematically suggested in the power supply 360 of FIG. 9, discussed below) or deliver a pulse-width-modulated current, for example. When the power supply 150 delivers electrical power to the flexor 142, the nitinol wire of the flexor 142 will be heated by resistance heating. If so desired, the first bond 144 joining the flexor 142 to the probe 120 may be formed of an insulating material to electrically isolate the probe 120 from the flexor 142. In the embodiment shown in FIGS. 2 and 3, though, this may be unnecessary. When actuator power is delivered from the power supply 150 to the flexor 142, the flexor 142 will change length, lifting the probe 120 out of electrical contact with the microelectronic component 50. As a result, the power delivered to the flexor 142 may have little or no impact on the microelectronic component 50.

In one embodiment, the actuator 140a of the first probe 120a and the actuator 140b of the second probe 120b are actuated at essentially the same time. This will cause the first and second probes 120a–b to move in unison. As explained below, this can be useful in a number of circumstances where different sets of probes have different functionalities and it is desirable to lift all of the probes of one set away from the microelectronic component 50 at one time, leaving the probes of the other set in position to contact the microelectronic component 50. If the first and second probes 120a–b are to be moved in unison, the actuators 140a–b may be electrically coupled to a common power supply 150. In this circumstance, the support 148 may carry wiring or serve as a bus bar that connects the first and second actuators 140a–b in parallel. In another embodiment, the controller (30 in FIG. 1) is adapted to separately control each of the actuators 140 and the controller 30 actuates both of the actuators 140a–b so the probes 120a–b move in unison. In another embodiment (not shown), the first and second probes 120a–b share a common actuator and actuating this single actuator can move both of the probes 120a–b.

In another embodiment, the first and second actuators 140a–b are independently actuatable. Actuating just the first actuator 140a will lift the first probe 120a away from the microelectronic component 50 while the second probe 120b remains stationary with respect to the microelectronic component 50. Similarly, the second probe 120b can be moved by delivering power to the actuator 140b while the first probe 120a remains stationary with respect to the microelectronic component 50.

Figure 4:
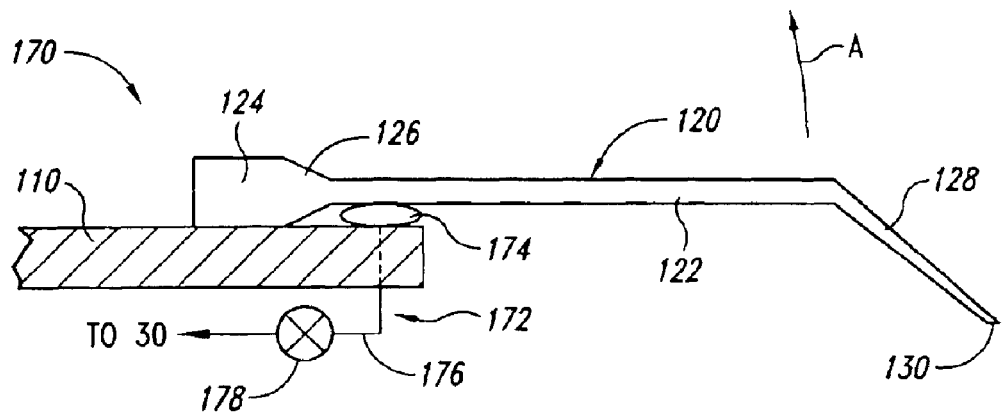
FIG. 4 is a schematic side view, similar to FIG. 3, illustrating a portion of a probe card in accordance with an alternative embodiment of the invention.
Figure 5:
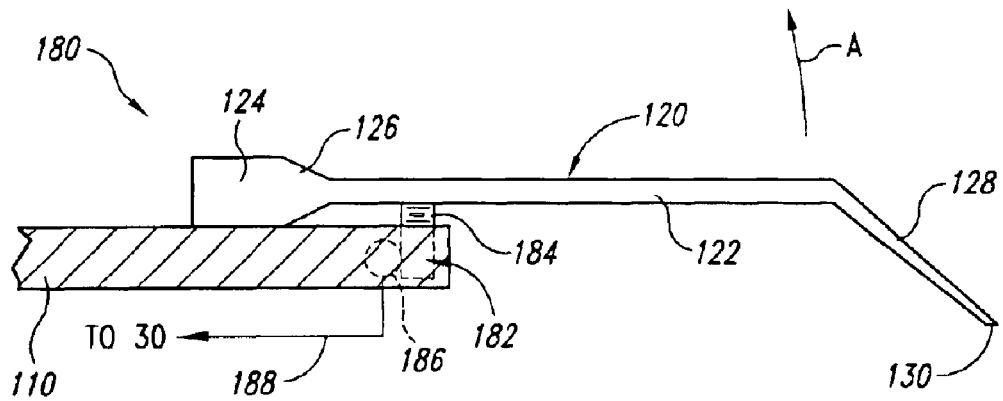
FIG. 5 is a schematic side view, similar to FIG. 3, of a portion of a probe card in accordance with another alternative embodiment.
Figure 6:
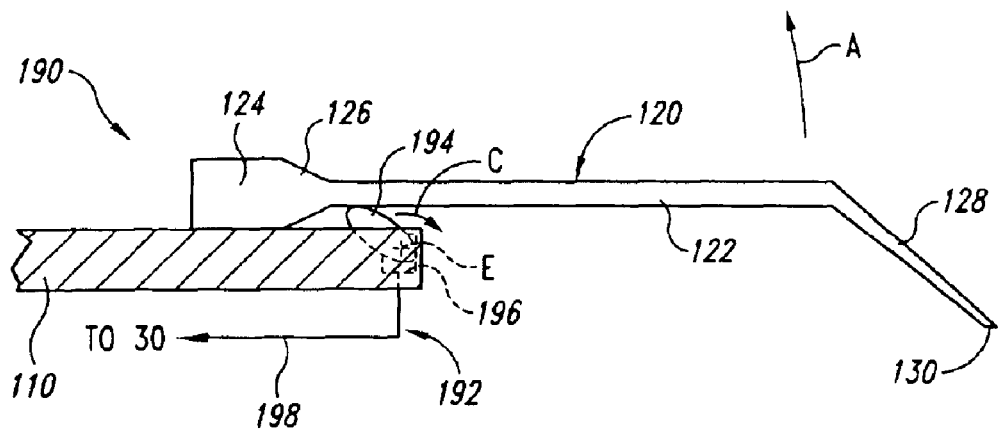
FIG. 6 is a schematic side view, similar to FIG. 3, of a portion of a probe card in accordance with still another alternative embodiment.

FIGS. 4–6 illustrate several alternative probe cards employing different kinds of actuators. In each of FIGS. 4–6, the actuator (172, 182, or 192) is adapted to apply force against an underside of the probe 120 to lift the probe 120. Aside from the different actuators, much of the rest of the structure of these probe cards 170, 180, and 190 may be the same as those discussed above in connection with the probe card 100. Accordingly, like reference numbers are used to designate like elements appearing in FIGS. 2–3 and in FIGS. 4–6.

The probe card 170 of FIG. 4 includes a fluid-driven actuator 172. This actuator 172 includes an inflatable bladder 174 carried by the base 110 beneath a length of the body 122 of the probe 120. Fluid may be delivered to or withdrawn from the bladder 174 via supply line 176. The controller 30 may operate a control valve 178 in the supply line 176. Delivering fluid to the bladder 174 will cause it to inflate, lifting the body 122 of the probe 120 in the direction indicated by arrow A. Allowing the fluid out of the bladder 174 will allow the probe to resiliently return toward the rest position illustrated in FIG. 4. The actuator 172 may operate pneumatically or hydraulically, preferably using a fluid that is compatible with other components of the probe card 170 and the microelectronic component 50.

FIG. 5 illustrates a probe card 180 that employs a screw-driven actuator 182. The actuator 182 includes a drive mechanism 186 carried by the base 110 and operatively connected to a threaded member 184. The drive mechanism 186 may, for example, comprise a worm gear, rotation of which will drive the threaded member 184 toward or away from the body 122 of the probe 120. Hence, the threaded member 184 may be advanced to lift the probe 120 in the direction of arrow A and retracting the threaded member 184 back toward the base 110 allows the probe body 122 to resiliently return toward the position shown in FIG. 5. The drive mechanism 186 may be operatively connected via a communication line 18 (which may be part of the circuitry 22 in FIG. 1) with the controller 30 and/or an actuator power supply.

FIG. 6 illustrates a probe card 190 that includes an actuator 192 in accordance with another embodiment. This actuator 192 includes an eccentric cam 194 coupled to a drive mechanism 196. The drive mechanism 196 can rotate the cam 194 about an eccentric axis E. This can change a distance between the axis E of the cam 194 and a point of contact between the cam 194 and the probe body 122. In the illustrated example, moving the cam 194 in the direction indicated by the arrow C will move the probe body 122 in the direction indicated by the arrow A. Rotating the cam 194 in the opposite direction allows the probe body 122 to resiliently return toward the position shown in FIG. 6. The drive mechanism 196 may communicate via communication line 198 with the controller 30 or with an actuation power supply (not shown). In one embodiment, the communication line 198 is part of the circuitry 22 (FIG. 1) of the probe card 190.

Figure 7:
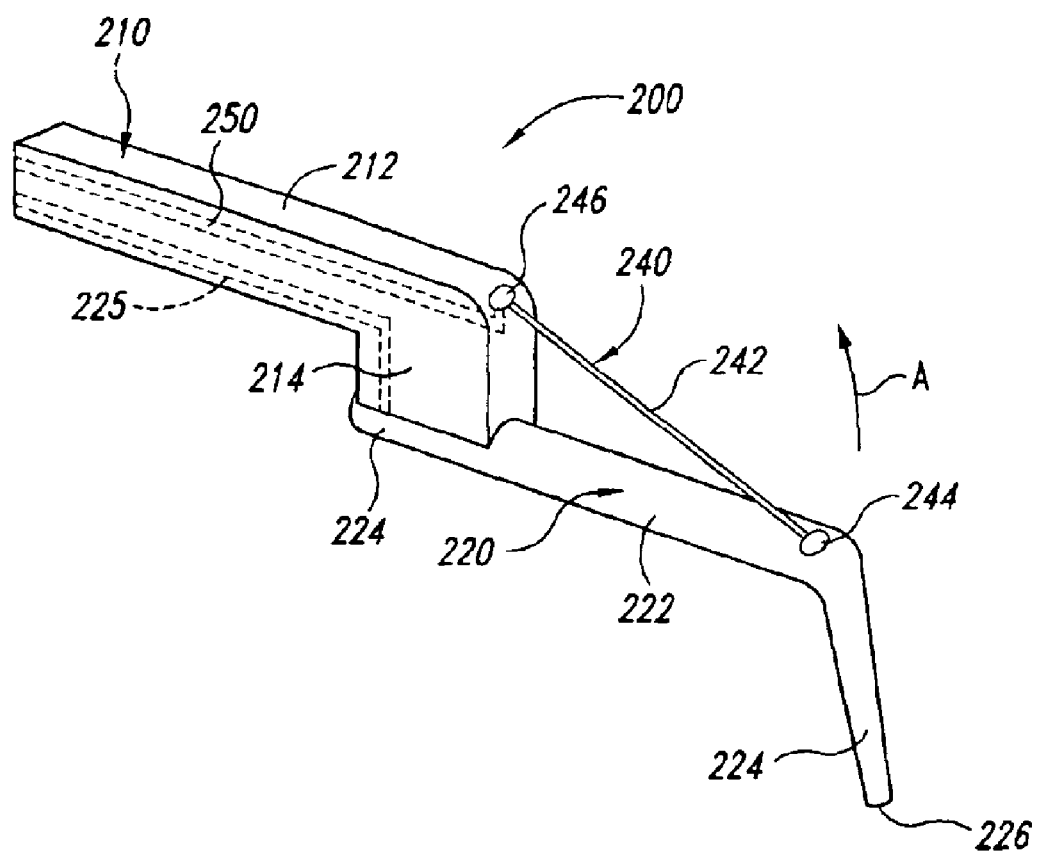
FIG. 7 is a schematic elevation view of a probe in accordance with another embodiment of the invention.

FIG. 7 schematically illustrates an exchangeable probe member 200 in accordance with an alternative embodiment. This probe member 200 includes a blade 210 and a probe 220. The blade 210 includes an elongate arm 212 and a shank 214. A proximal length 224 of the probe 220 may be attached to the shank 214 of the blade. An elongate, flexible body 222 of the probe extends distally beyond the blade 210. A distal length 224 of the probe 220 may taper distally and be angled downwardly (in the orientation shown in FIG. 7) to terminate at a probe tip 226. A probe power line 225 carried by the blade 210 may be electrically coupled to the probe 220 and enable connection of the probe 220 to a power supply (e.g., the power supply 36 in FIG. 1).

The exchangeable probe member 200 of FIG. 7 also includes an actuator 240. This actuator 240 is analogous to the actuator 140 shown in FIGS. 2 and 3. The actuator 240 includes a flexor 242 that is attached at one end to the probe body 222 by a first bond 244. The other end of the flexor 242 may be connected to the blade 210 by a second bond 246. FIG. 7 also schematically illustrates an actuator power supply line 250 carried by the blade 210, which can deliver actuation power to the actuator 240. As in the embodiment discussed above in connection with FIGS. 2 and 3, delivery of electrical power to the flexor 242 will cause it to heat up and, in turn, change length. This change in length will deflect the probe 220, as indicated by the arrow A in FIG. 7.

The blade 210 of the exchangeable probe member 200 may be configured to interface with a probe card (not shown in FIG. 7). Exchangeable probes and probe cards for use with exchangeable probes are commercially available from a number of sources, e.g., Kulicke & Soffa of Gilbert, Ariz., USA. In one embodiment, the exchangeable probe member 200 may be configured for use with Kulicke & Soffa's PCS 600 probe card. The PCS 600 probe card may need to be adapted to deliver actuation power to the actuator 240.

Figure 8:
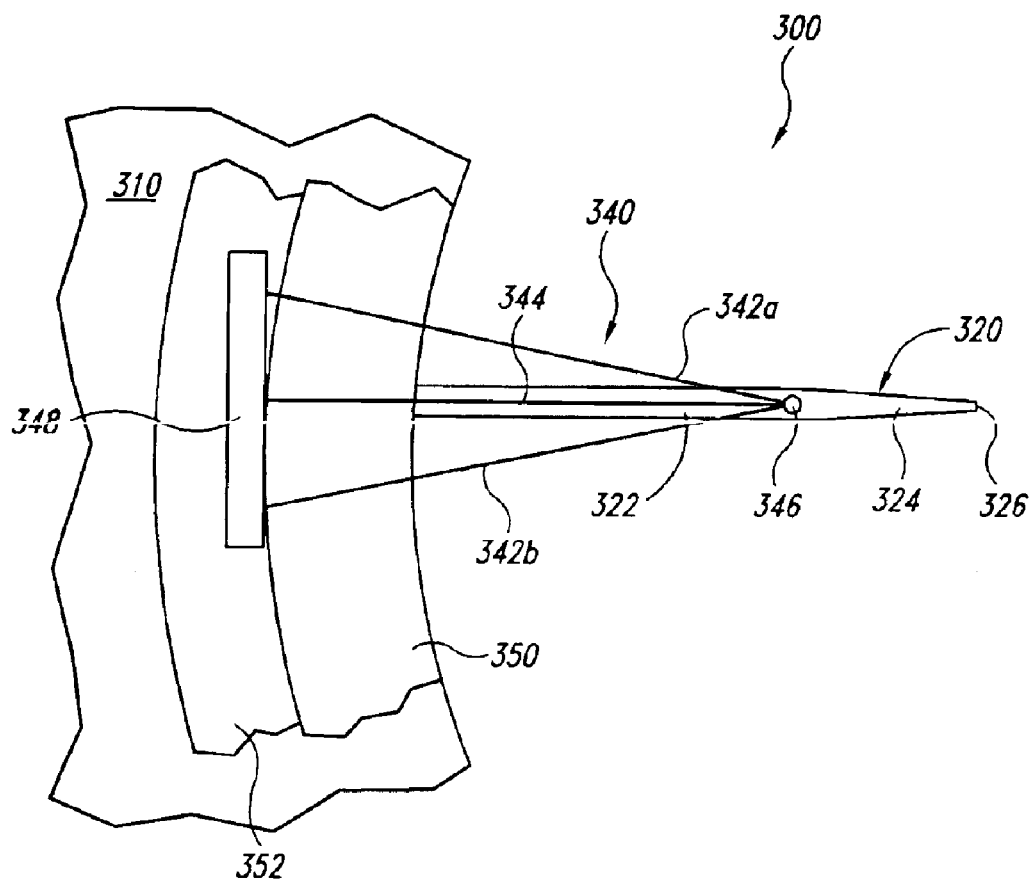
FIG. 8 is a schematic top view of a portion of a probe card in accordance with a different embodiment of the invention.
Figure 9:
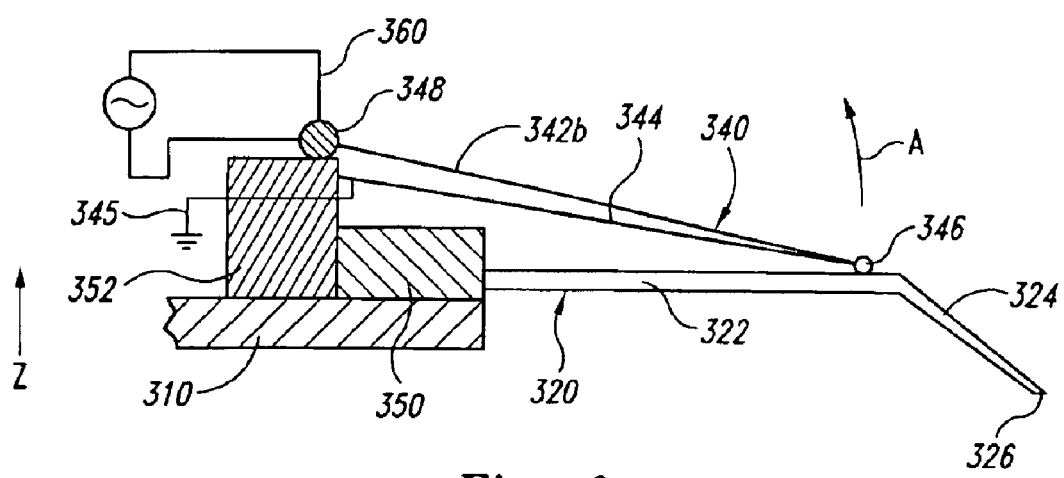
FIG. 9 is a schematic cross-sectional view of the device of FIG. 8.

FIGS. 8 and 9 schematically illustrate a probe card 300 in accordance with another alternative embodiment. The probe card 300 includes a base 310 and a probe 320 carried by the base 310. The portion of the probe card illustrated in FIG. 8 shows only one probe 320. It should be understood, though, that any number of probes may be employed, as discussed above in connection with FIG. 2. The probe 320 in the illustrated embodiment is a cantilevered wire probe having a body 322 and a distally tapering distal length 324 disposed at an angle to the body 322 and terminating in a probe tip 326. The probe 320 may be connected to the base in any desired fashion. In the illustrated embodiment, the probe 320 is attached to the base 310 using an epoxy resin ring 350. This basic mechanical structure is directly analogous to conventional epoxy cantilever probe cards such as those commercially available from Kulicke & Soffa. Suitable materials and structures for the base 310 and the epoxy ring 350 are well-known in the art and need be detailed here.

The probe card 300 of FIGS. 8 and 9 also includes a stiffening ring 352 that may be positioned proximate the epoxy ring 350. This stiffening 352 may extend outwardly from a surface of the base 310 in the Z direction (FIG. 6) to a height above the probe body 322.

Each probe 320 of the probe card 300 has an actuator 340 associated therewith. The actuator 340 in this embodiment includes a first flexor 342a, a second flexor 342b, and a ground wire 344. The first and second flexors 342a–b may each be connected at one end to a common first bond 346 which is, in turn, attached to the probe body 322. The other end of each of the flexors 342 may be attached to a bus bar 348 carried by the stiffening ring 352. In the illustrated embodiment, the bus bar 348 is associated with a single actuator 340 of a single probe 320. If so desired, the bus bar 348 may extend along a length of the stiffener ring 352 to deliver electrical power to a plurality of actuators 340 from the power supply 360. These flexors 342 may be formed of a material that changes length upon application of a voltage either directly (as in the case of a piezoelectric element) or indirectly (as in the case of a heat-responsive shape memory material).

The bus bar 348 is positioned farther from the base 310 in the Z direction than is the first bond 346 connecting the flexors to the probe body 322. As a consequence, when the flexors are actuated and shortened in length, they will tend to lift the probe body upwardly in the Z direction, as illustrated by arrow A in FIG. 9. Using two or more flexors 342 instead of the single flexor 140 shown in FIG. 2 can increase the force exerted by the actuator 340 on the probe 320, making it easier to bend the probe from its rest position (shown in FIGS. 8 and 9) to a position spaced from a microelectronic component. In some applications, particularly where a large number of fairly closely-spaced probes are employed, it may be desirable to limit lateral movement of the probe tip 326 when the actuator 340 is actuated. To help reduce such lateral movement, the length, material, and other characteristics of the flexors 342a and 342b may be substantially the same. In addition, the two flexors 342a–b may be oriented at the same angle with respect to the probe body 322, essentially forming an isosceles triangle with the bus bar 348. In this manner, the lateral forces exerted by the two flexors 342a–b will be substantially equal and substantially cancel one another out.

The actuator 340 also includes a ground wire 344. The ground wire may be coupled at a first end to both of the flexors 342a–b and extend proximally from the first bond 346 toward the base 310. This ground wire 344 may serve to complete a circuit by connecting the flexors 342 to ground 345. In one embodiment, the ground wire 344 is formed of the same type of material as the flexors 342 and may contribute to the force exerted by the actuator 340. In another embodiment, the ground wire 344 is formed of an electrically conductive material that does not exhibit the same electrical or thermal response as the material from which the flexors 342 are formed.

D. Probes Moveable in an X-Y Plane

The probes 120, 220, and 320 of FIGS. 2–9 are movable in a Z direction (as illustrated in FIG. 3). This capability allows the probes 120, 220, 320 to be lifted away from a microelectronic component to engage or disengage a contact 52 on a microelectronic component 50. As noted above, though, it would be advantageous in some applications to move the probe laterally, e.g., to establish or maintain an electrical connection with a microelectronic component contact 52. FIGS. 10–14 schematically illustrate select embodiments of probes and probe cards that may be used to move the tip of the probe laterally.

Figure 10:
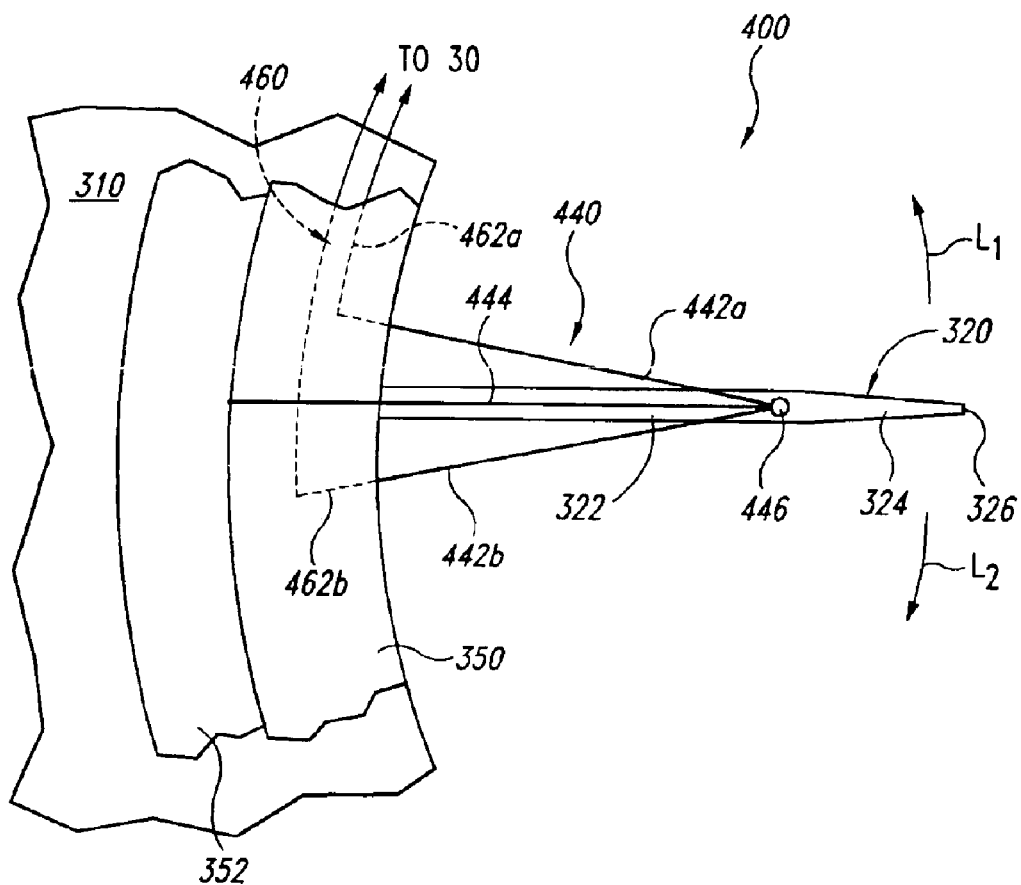
FIG. 10 is a schematic top view of a portion of a probe card in accordance with yet another embodiment of the invention.
Figure 11:
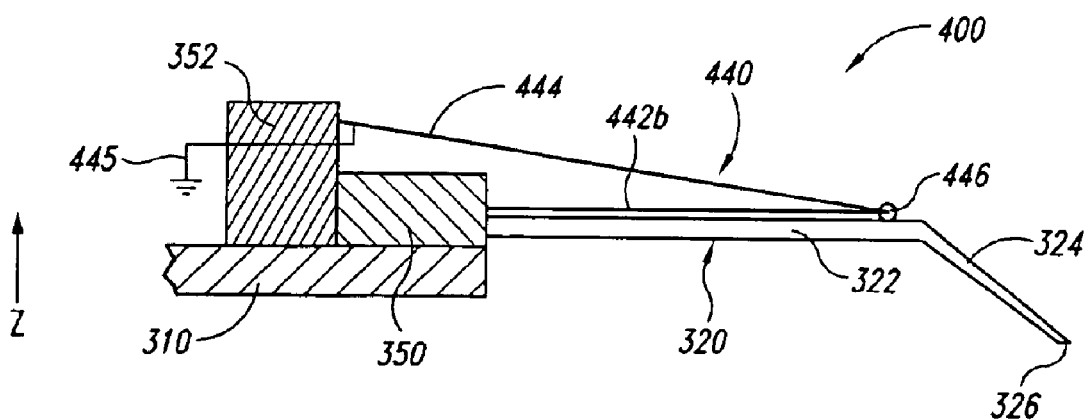
FIG. 11 is a schematic cross-sectional view of the device of FIG. 10.

FIGS. 10 and 11 illustrate a probe card 400 in accordance with another embodiment of the invention. This probe card 400 may be based on an epoxy ring cantilever design similar to that discussed above in connection with FIGS. 8 and 9. Like reference numbers are used in FIGS. 8–11 to refer to like structures. The actuator 340 in FIGS. 8 and 9 is adapted to move the probe in a Z-axis direction. The actuator 440 of the probe card 400, however, is instead adapted to move the probe tip 326 laterally as indicated by the arrows $L_1$ and $L_2$. This actuator 440 includes a first flexor 442a and a second flexor 442b connected to the probe body 322 via a first bond 446. As with the flexors 142, 242, and 342 discussed above, the flexors 442 in FIGS. 10–11 may be formed of a material adapted to change length in response to an applied voltage or a temperature change. A ground wire 444 may be coupled to the flexors 442 adjacent or within the first bond 446 and connected to ground 445.

In the embodiment of FIGS. 8 and 9, the bus bar 348 was positioned higher along the Z-axis than the first bond 346. Accordingly, upon actuation of the flexors 342, the actuator 340 lifted the probe body 322 in the Z direction, as shown by arrow A. In the embodiment of FIGS. 10 and 11, however, the flexors 442a–b lie in a plane which is perpendicular to the Z-axis. In the orientation illustrated in FIG. 11, these flexors 442 extend generally horizontally from the epoxy ring 350 to the first bond 446. Actuation of these flexors 442, therefore, should induce little or no movement in the Z direction. In one embodiment, the ground wire 444 is also generally horizontal and may be formed of the same type of length-changing material as the flexors 442. In the illustrated embodiment wherein the ground wire has a slope with respect to the Z-axis, though, the ground wire 444 may be formed of an electrically conductive material with relatively little or no change in length when actuation power is delivered to the flexors 442.

The first and second flexors 442a–b may be connected via actuator power supply circuit 460 and the controller 30 to a power supply 36 (FIG. 1). This actuator power supply circuit 460 is schematically illustrated as being embedded in the epoxy ring 350; if so desired, it could be a part of the circuitry of the base 310 instead, or be provided in any other suitable fashion. The actuator power supply circuit 460 may include a first power supply line 462a connected to the first flexor 442a and a second power supply line 462b connected to the second flexor 442b. Both of these lines 462 may be connected to the power supply 36 via the controller 30 and the controller may deliver actuating power to the first and second flexors 442a–b independently of one another.

Delivery of electrical power to the first flexor 442a will cause the flexor 442a to shorten. This deflects the probe tip 326 in a first lateral direction $L_1$. If the flexor is deactivated so it can relax, the probe 320 will tend to resiliently return to the rest position shown in FIG. 10. Delivering actuation power to the second flexor 442b will cause the probe tip 326 to deflect in an opposite lateral direction $L_2$. Terminating the power to the second flexor 442b and allowing it to cool will allow the probe 320 to resiliently return in the direction $L_1$, toward the rest position shown in FIG. 10. In another embodiment, the controller 30 may deliver electrical power to both of the flexors 442 at the same time, but deliver more power to one of the flexors 442 than to the other. This will cause one of the flexors to shorten more than the other to move the probe tip 326 laterally in direction $L_1$ or $L_2$.

As mentioned below, one advantage of moving the probe 320 laterally in this fashion is that it facilitates alignment of the probe tip 326 with a contact 52 on a microelectronic component 50. In one application, test power will be delivered via the probe 320 to measure performance of the microelectronic component 50. In one embodiment, the first bond 446 is formed of an electrically insulative material to help electrically isolate the probe 320 from the flexor 440. This will help reduce the likelihood that the actuation power delivered to the actuator 440 could interfere with the signal delivered by the probe 320 to the contact 52.

Figure 12:
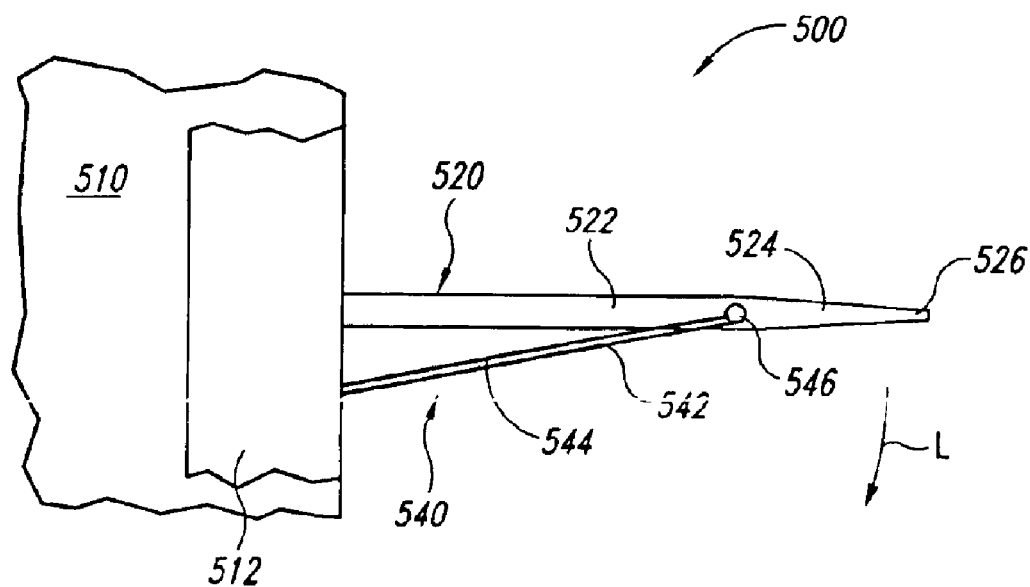
FIG. 12 is a schematic top view of a portion of a probe card in accordance with still another alternative embodiment of the invention.

FIG. 12 illustrates a probe card 500 in accordance with yet another embodiment of the invention. This probe card includes a base 510 and a probe 520. The probe 520 may be coupled to the base 510 in any suitable fashion. In the schematic illustration of FIG. 12, the bond between the probe 520 and the base 510 is shown as an epoxy bond 512 similar to the epoxy ring 350 of FIGS. 8–11. The probe 520 includes an elongate flexible body 522 and a distally tapering distal length 524 terminating in a probe tip 526. The probe card 500 includes an actuator 540 adapted to laterally articulate the probe 520. This actuator 540 includes a pair of flexors 542 and 544 operatively connected to the probe body 522 by an electrically insulative bond 546. The pair of flexors 542, 544 may be electrically coupled to the power supply 36 via the controller 30. One of the flexors 542 may receive power from the power supply and the other flexor 544 may complete the circuit. This will cause both of the flexors 542 and 544 to heat and, therefore, contract. Contraction of the flexors 542 and 544 will move the probe tip 526 laterally in the direction of the arrow L.

Figure 13:
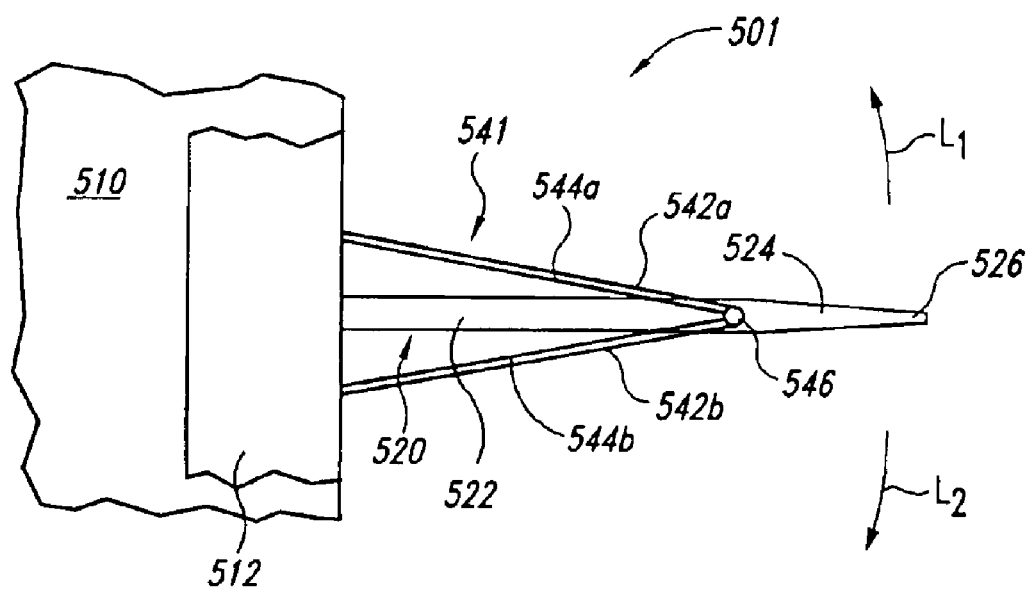
FIG. 13 is a schematic top view of a portion of a probe card in accordance with a further embodiment of the invention.

FIG. 13 illustrates a probe card 501 that has a number of components in common with the probe card 500 of FIG. 12; like elements in these two Figures bear like reference numbers. The actuator 541 of FIG. 13 includes a first pair of flexors 542a and 544a and a second pair of flexors 542b and 544b. Each of these flexor pairs may be separately connected to an actuator power supply (not shown) via the controller 30 (FIG. 1). Applying a voltage to the first pair of flexors 542a, 544a will cause the probe tip 526 to move laterally in a first direction $L_1$. Applying a voltage to the other pair of flexors 542b, 544b will cause the probe tip 526 to move laterally in the opposite direction $L_2$.

The general structure and operation of the probe card 500 and the probe card 501 is similar. The actuator 540 of FIG. 12, however, can move the probe tip 526 laterally only in one direction L. The actuator 541 of FIG. 13, in contrast, allows the probe 520 to be deflected in two lateral directions $L_1$ and $L_2$ from the rest position shown in FIG. 13.

E. Methods

As noted above, some embodiments of the invention provide methods of testing microelectronic components 50. Probe cards having one or more probes that are selectively positionable with respect to the microelectronic component provide a range of processing possibilities. The following discussion outlines select applications of these probe cards; other applications for these probe cards will become apparent to those skilled in the art in light of the present disclosure.

The following discussion refers back to the specific embodiments illustrated in FIGS. 1–13. It should be understood that this is solely for purposes of illustration and that the methods are not to be limited to the specific structures shown in FIGS. 1–13. In particular, any probe card which is suitable to perform the specific described function may be employed, even if those probe cards differ from the structures outlined above and shown in FIGS. 1–13.

Figure 14:
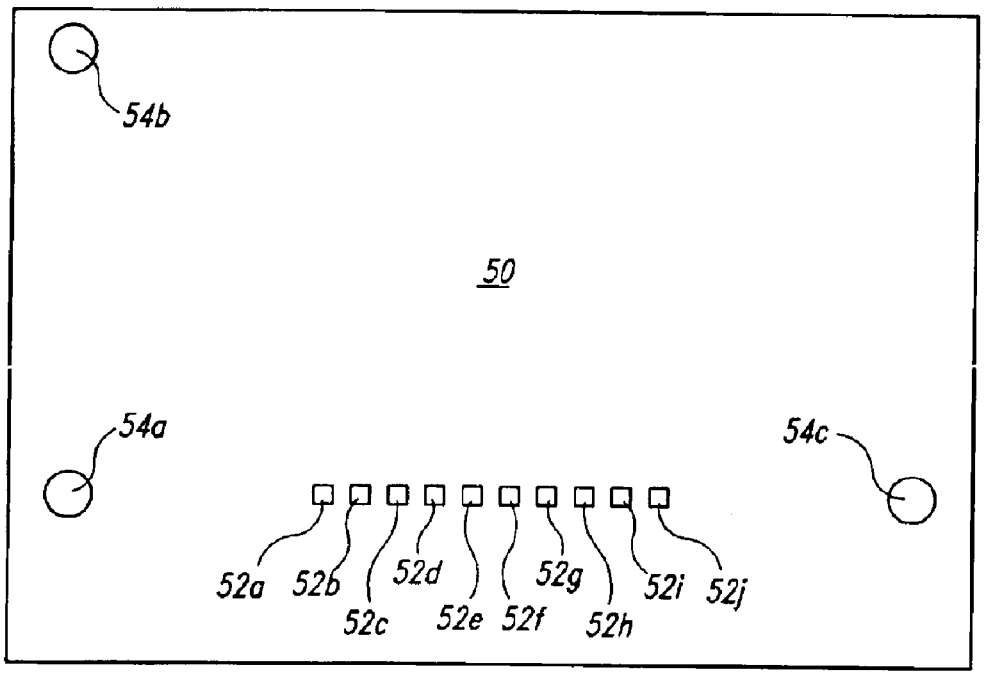
FIG. 14 is a schematic illustration of a microelectronic component including test contacts and fiducial contacts that may be employed in a method of an embodiment of the invention.

FIG. 14 schematically illustrates one particular microelectronic component 1050 having a plurality of test contacts 1052 and a plurality of fiducial contacts 1054. In this particular embodiment, the test contacts 1052a–j are arranged to extend in a row. These test contacts 1052a–j are relatively small and are spaced fairly close together. (It should be understood that FIG. 14 is merely a schematic drawing to illustrate certain concepts. The relative scale and spacing of the test contacts 1052 on the microelectronic component 1050 may differ significantly from one application to another.) When testing such a microelectronic component 1050 with a conventional probe card, the probe card will be positioned proximate the microelectronic component 1050. Conventional systems for aligning the probes of a probe card with test contacts 1052 of a microelectronic component 1050 typically rely on an optical alignment system which views the microelectronic component from above, similar to the view of FIG. 14. Because the probes interfere with a clear view of the test contacts 1052, it can be difficult to accurately align the test probes with the contacts. In particular, skew of the line of probes with respect to the line of contacts can lead to positioning of some of the probes in insufficient contact with the test contacts 1052.

The microelectronic component 1050 of FIG. 14 includes a plurality of fiducial contacts 1054a–c. These fiducial contacts may be spaced farther from one another than are the test contacts 1052a–j. In the illustrated embodiment, the fiducial contacts 1054a–c are arranged in a non-linear array; in FIG. 14, this array is generally triangular in shape.

In testing the microelectronic component 1050, a probe card in accordance with an embodiment of the invention may be positioned proximate the microelectronic component 1050, as illustrated schematically in FIG. 1. For example, a probe card 100 similar to that illustrated in FIG. 2 may be employed. If the probe card 100 were specifically configured for use with the microelectronic component 1050 of FIG. 14, for example, the probe card 100 may include ten test probes, with one test probe being arranged to contact each of the test contacts 1052a–j. The test probe 100 may also include a plurality of selectively positionable probes similar to probes 120a–b in FIG. 2. In particular, the selectively positionable probes would be arranged on the base 110 of the probe card 100 to position the probe tips 130 of these probes adjacent one of the fiducial contacts 1054 when the set of test probes is properly positioned with respect to the test contacts 1052.

In accordance with one method of the invention, such a probe card 100 may be positioned adjacent the microelectronic component 1050 with the probes positioned in a rest position. In this rest position, the tips of the test probes may be substantially coplanar with the surfaces of the test contacts 1052 and the probe tips 130 of the fiducial probes 120 may be substantially coplanar with the fiducial contacts 1054a–c. Power may be delivered to the fiducial probes 120 when the probe card 100 is positioned in a default position adjacent the microelectronic component 1050. The fiducial probes 120, the test probes, and/or the microelectronic component 1050 may be monitored to detect an electrical signal which confirms that the fiducial probes 120 are in contact with the fiducial contacts 1054a–c. If this electrical signal is not detected, the probe card 100 may be moved slightly relative to the microelectronic component 1050 and power may be delivered to the fiducial probes 120 again. This process may be repeated until all of the fiducial probes are aligned with their respective fiducial contacts 1054a–c.

Once the position of the fiducial probes 120 with respect to the fiducial contacts 1054 has been confirmed, the fiducial probes 120 may be lifted away from the plane of the fiducial contacts 1054. In the embodiment of FIGS. 2–3, for example, this may be accomplished by applying a voltage to the flexors 142 of the actuators 140. While the actuators 140 hold the fiducial probes 120 out of contact with the fiducial contacts 1054, test power may be delivered to the test probes in a conventional manner. By properly aligning the fiducial probes 120 with respect to the fiducial contacts 1054, fairly precise alignment of the test probes with the test contacts 1052 may be assured, limiting the likelihood that a satisfactory microelectronic component 1050 may be rejected as defective because it did not respond properly to the test signals from the test probes.

Figure 15A:
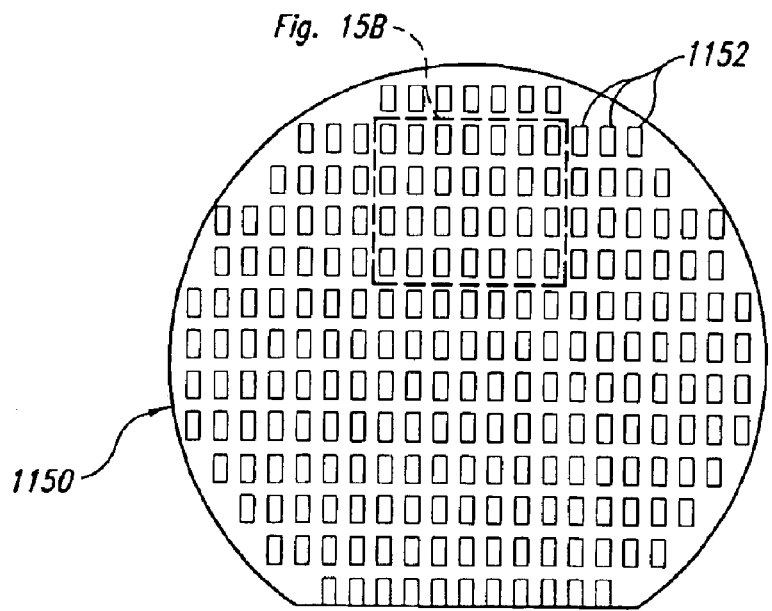
FIG. 15A illustrates a semiconductor wafer and FIG. 15B schematically illustrates a portion of that wafer having parametric contacts which may be tested in a method in accordance with another embodiment of the invention.
Figure 15B:
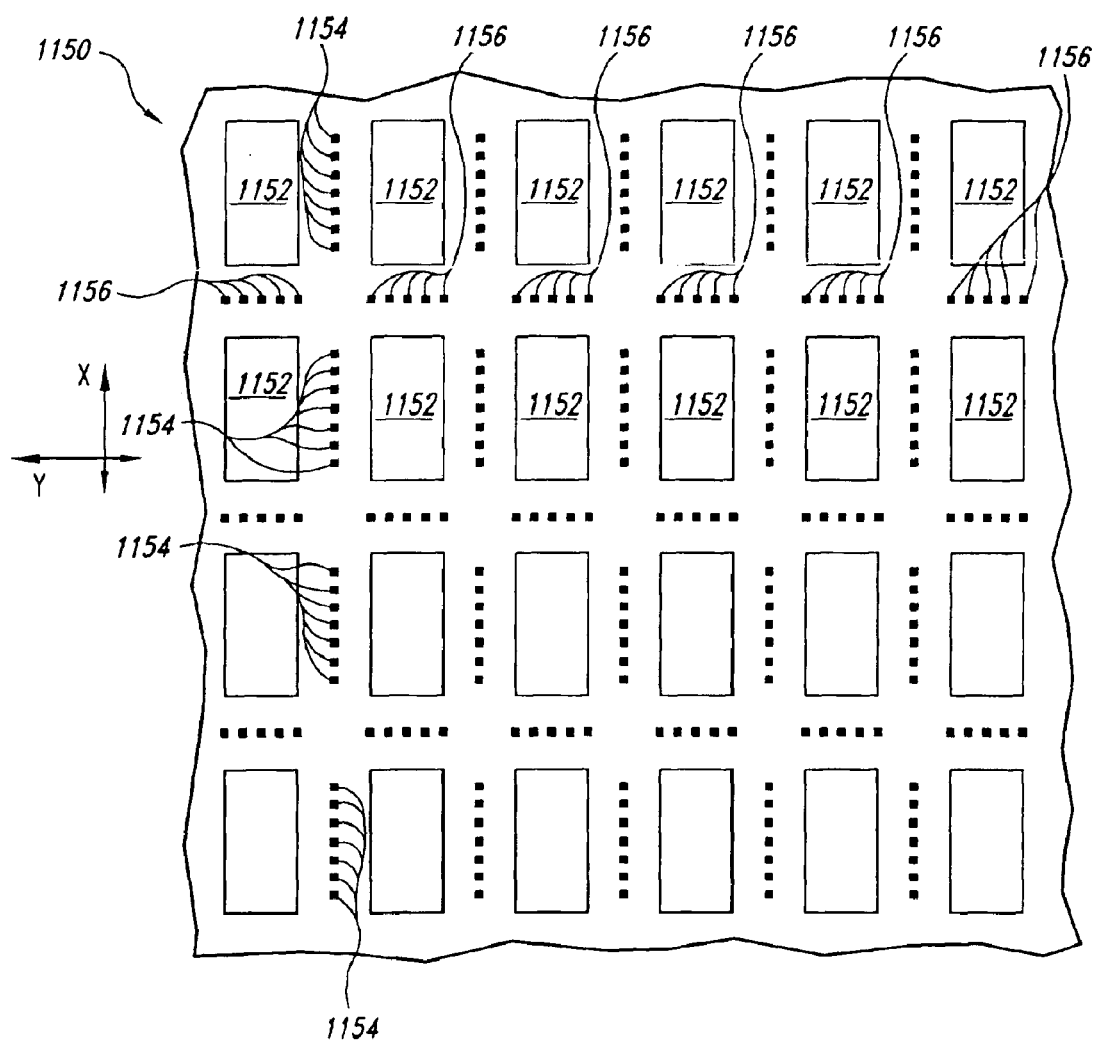

FIGS. 15A–B illustrate another microelectronic component 1150 which may be tested with a probe card in accordance with an embodiment of the invention. This microelectronic component 1150 may comprise a semiconductor wafer carrying a plurality of integrated circuit dies 1152. These dies 1152 are commonly arranged in a regular array with two perpendicularly oriented sets of parallel "streets." The dies 1152 may be singulated from the wafer 1150 by scribing each of the streets with a wafer saw, as is known in the art. As best seen in FIG. 15B, the wafer may include a plurality of parametric contacts 1154, 1156 arranged in the streets. These parametric contacts 1154, 1156 may be interrogated at one or more stages during processing of the wafer 1150 to ensure that certain measured parameters are within acceptable tolerances. Currently, these parametric contacts 1154, 1156 are commonly tested with a conventional probe card.

The arrangement of the dies 1152 and the parametric contacts 1154, 1156 may vary from one semiconductor wafer 1150 to another, depending on the type of die 1152 being produced. As noted above, variations in geometry from one wafer 1150 to another are sometimes addressed with a custom probe card for each wafer design. Other times, a single probe card is adapted to contact a first set of parametric contacts 1154 arranged to extend in a first direction along a single street or a specified number of parallel streets. The wafer 1150 can be turned 90° and the same probe card may be used to contact a second set of parametric contacts 1156 arranged to extend in a second direction perpendicular to the first direction.

A method in accordance with one embodiment of the invention employs a single probe card to selectively contact the first set of parametric contacts 1154 and the second set of parametric contacts 1156 in two discrete operations without necessitating moving the base of the probe card with respect to the wafer 1150. Such a method may employ a probe card 100 similar to that illustrated in FIG. 2. One set of first probes 120a may have probe tips 130a arranged to extend in an X direction (FIG. 15B) and a set of second probes 120b may have probe tips 130b arranged to extend in a perpendicular Y direction (FIG. 15B). If so desired, the actuators 140a of each of the first probes 120a may be connected in parallel to a power supply 36 via a controller 30 (FIG. 1). The actuators 140b of the second set of probes 120b may also be connected in parallel with one another to the power supply 36 via the controller 30, but the controller 30 may actuate the actuators 140a of the first probes 120a independently of the actuators 140b of the second probes 120b.

In use, the base 110 of such a probe card 100 may be positioned relative to the wafer 1150 to position each of the first probes 120a relative to one of the set of first parametric contacts 1154 and simultaneously position each of the second probes 120b relative to one of the set of second parametric contacts 1156.

In one embodiment, the actuators 140b of the second probes 120b are actuated during the positioning process, keeping the probe tips 130b of the second probes 120b spaced farther away from the surface of the wafer 1150 than are the probe tips 130a of the first probes 120a. In this fashion, when the probe card is properly positioned with respect to the microelectronic component, the first probes 120a may be brought into contact with one or more sets of the first parametric contacts 1154.

In another embodiment, none of the actuators 140a–b are actuated during the process of positioning the probe card with respect to the wafer 1150. Once the probe card is properly positioned, the second actuators 140b may be actuated to lift the second probes away from the wafer 1150. In another alternative approach, all of the actuators 140a–b are actuated during positioning of the probe card and the first actuators 140a are deactivated after the probe card is properly positioned. This will allow the first probes 120a to resiliently return toward their rest position, wherein the probe tips 130a may contact the parametric contacts 1154.

Each of these processes for aligning the probe card with respect to the wafer 1150 will arrive at the same end, wherein the probe tips 130a of the first probes 120a are in contact with the first parametric contacts 1154 and the probe tips 130b of the second probes 120b are positioned in a spaced relationship relative to the second parametric contacts 1156. In this configuration, test power may be delivered to the first parametric contacts 1154 via the first probes 120a to interrogate the parametric test structures in a conventional fashion. In one embodiment, the actuators 140b of the second probes 120b are actuated during the entire test using the first probes 120a.

After the first probes 120a have been used to test the first parametric contacts 1154, the first probes may be moved out of electrical contact with the parametric contacts 1154. This can be accomplished by activating the actuators 140a of the first probes 120a, lifting the probe tips 130a in the Z direction, away from the plane of the first parametric contacts 1154, without moving the base 110 of the probe card 100. The actuators 140b of the second probes 120b may be deactivated, allowing the probes 120b to resiliently move into electrical contact with the second parametric contacts 1156. The second probes 120b may be moved into contact with the second parametric contacts 1156 before, after, or during the process of moving the first probes out of electrical contact with the first parametric contacts 1154. Test power may be delivered to the second parametric contacts 1156 through the second probes 120b. In one embodiment, the first actuators 140a are actuated during the testing of the second parametric contacts 1156 so that only the second probes 120b are in electrical contact with the wafer 1150 during the second testing process.

Figure 16:
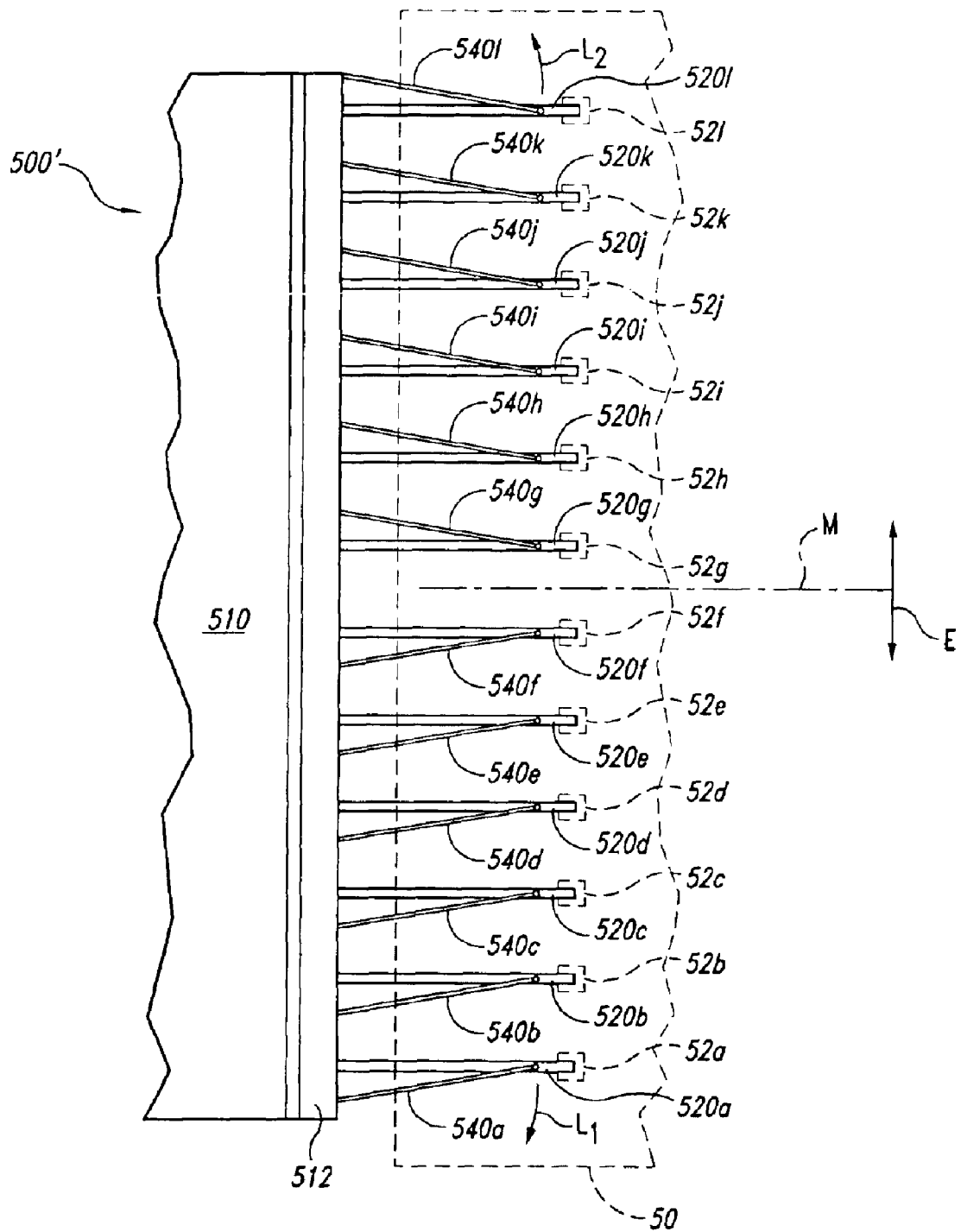
FIG. 16 is a schematic top view of one embodiment of a probe card including a plurality of probes similar to the probe illustrated in FIG. 12.

FIG. 16 schematically illustrates a specific implementation of the probe card 500 shown in FIG. 12 that may be useful in connection with a method of another embodiment of the invention. The probe card 500' shown in FIG. 16 includes a base 510 and a plurality of probes 520A–L attached to the base 510 by an epoxy 512. Each of the probes 520 includes an actuator 540. Hence, probe 520A includes an actuator 540A, probe 520B includes an actuator 540B, etc. The probes 520 and actuators 540 of the probe card 500' may be essentially the same as those discussed above in connection with the probe card 500 of FIG. 12. FIG. 16 illustrates the probe card 500' positioned with respect to a microelectronic component 50 with each of the probes 520A–L in electrical contact with a contact 52A–L, respectively, of the microelectronic component 50. In this configuration, test power may be delivered to the contacts 52 through the associated probes 520 to test the microelectronic component 50 in a conventional fashion.

In some circumstances, it may be necessary to test the microelectronic component 50 at an elevated temperature or a reduced temperature. As the microelectronic component 50 changes temperature, it may expand or contract. Even if each of the probes 520 is properly aligned with one of the contacts 52 of the component 50 at a first temperature, expansion or contraction of the microelectronic component 50 relative to the probe card 500' with varying temperatures can move the contacts 52 out of alignment with the probes 520. Currently, this is addressed by manufacturing two or more different probe cards for a single type of microelectronic component 50, with each of the probe cards being configured to position the probes to contact the contacts 52 at a given temperature.

The use of the actuators 540 on the probe card 500' can obviate the need for a separate probe card for each test temperature. As the temperature of the microelectronic component 50 increases, for example, it will tend to expand outwardly with respect to a midline M of the probe card 500', as illustrated by the arrow E. In the illustrated embodiment, each of the probes 520A–F on one side of the midline M is adapted to be moved by its associated actuator 540A–F, respectively, in a direction away from the midline, as indicated by arrow $L_1$. The probes 520G–L on the other side of the midline M are movable by the actuators 540G–L away from the midline M in a second direction, as indicated by the arrow $L_2$. In one embodiment, the force exerted by each of the actuators 540 on its respective probe 520 is substantially the same along the length of the probe card 500'. In another embodiment, the force of each actuator 540 may be proportional to the expected magnitude of the change in position of the associated contact 52. Hence, the actuator 540A may exert more force on the probe 520A than the actuator 540F exerts on the probe 520F. This can be accomplished in a variety of ways, e.g., by varying the power applied to the different actuators 540 or using a different wire thickness in the flexors 542 (FIG. 12) of the different actuators 540. For example, a thicker wire of a shape memory material may exert a greater force at the same temperature change than would a thinner wire, so the thicker wire could be used in the actuator 540A and a thinner wire can be used in the actuator 540F.

In one mode of operation of the probe card 500', the probes 520A–L can be positioned to electrically contact the contacts 52A–L, respectively, of the microelectronic component 50 at a first temperature. The microelectronic component 50 may then be heated to a second test temperature, wherein the contacts 52A–L assume a different relative position. Prior to testing the microelectronic component 50 at this elevated temperature, the actuators 540A–L may be actuated to move the probes 520A–L, respectively, away from the rest positions shown in FIG. 16 to a second position. In this second position, the tips of the probes 520A–L may be more precisely aligned with the arrangement of the contacts 52A–L in the high-temperature configuration. The microelectronic component 50 can then be tested at the higher temperature by delivering test power to the contacts 52 via the probes 520.

Unless the context clearly requires otherwise, through out the description and the claims, the words "comprise," "comprising," and the like are to be construed in an inclusive sense as opposed to an exclusive or exhaustive sense; that is to say, in a sense of "including, but not limited to." When the claims use the word "or" in reference to a list of two or more items, that word covers all of the following interpretations of the word: any of the items in the list, all of the items in the list and any combination of the items in the list. Words using the singular or plural number also include the plural or singular number respectively.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention. For example, while steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A probe card adapted to test a microelectronic component, comprising:
   a base;
   a first probe carried by the base, the probe having a rest position in which it is positioned for electrical contact with an electrical contact on the microelectronic component and the probe being adapted to resiliently return toward the rest position;
   an actuator power circuit;
   a first actuator associated with the first probe and operatively coupled to the actuator power circuit, the first actuator being adapted to selectively move the first probe away from its rest position and away from the electrical contact upon delivery of actuation power from the actuator power circuit; and
   a test power circuit coupled to the first probe and adapted to deliver test power to the first probe.

2. The probe card of claim 1, wherein the first actuator is adapted to selectively lift a tip of the first probe above a plane of the first electrical contact.

3. The probe card of claim 1, wherein the first actuator is adapted to selectively move a tip of the first probe laterally.

4. The probe card of claim 3, wherein the actuator is adapted to selectively move the first probe in a first direction from the rest position and to selectively move the first probe in a second direction from the rest position.

5. The probe card of claim 1, wherein the first actuator comprises a flexor operatively connected to the first probe and to the base, the flexor changing length to change the position of the first probe.

6. The probe card of claim 5, wherein the flexor is adapted to selectively lift a tip of the first probe above a plane of the first electrical contact when the flexor is shortened.

7. The probe card of claim 5, wherein the flexor is adapted to change length in response to an applied voltage.

8. The probe card of claim 5, wherein the flexor is adapted to change length in response to a temperature change.

9. The probe card of claim 5, wherein the flexor comprises a shape memory material.

10. The probe card of claim 5, further comprising an actuator power circuit electrically coupled to the flexor and adapted to selectively apply actuation power to the flexor to change the length of the flexor.

11. The probe card of claim 1, wherein the first actuator comprises a flexor operatively connected to the first probe and to the base, the flexor being adapted to change length by selective heating of the flexor.

12. The probe card of claim 1, wherein the first actuator comprises a selectively controllable lift positioned to apply force against an underside of the first probe.

13. The probe card of claim 1, further comprising a second probe carried by the base, the test power circuit delivering power to the second probe only when the first probe is positioned at a location spaced from the first electrical contact.

14. The probe card of claim 1, further comprising a second probe carried by the base, the first and second probes being arranged to position the second probe proximate to a second electrical contact on the microelectronic component when the first probe is positioned proximate to the first electrical contact.

15. The probe card of claim 14, wherein the second probe remains stationary with respect to the base when the first actuator moves the first probe.

16. The probe card of claim 14, further comprising a second actuator associated with the second probe, the second actuator being adapted to selectively position the second probe independently of the first probe.

17. The probe card of claim 1, further comprising a second probe carried by the base and a second actuator associated with the second probe, the second actuator being adapted to selectively position the second probe.

18. The probe card of claim 17, wherein the second actuator is adapted to position the second probe independently of the first probe.

19. The probe card of claim 17 wherein the first and second actuators are adapted to position the first and second probes in unison.

20. The probe card of claim 1, wherein the probe comprises a cantilevered wire probe extending beyond an edge of the base.

21. A probe card adapted to test a microelectronic component, comprising:
   a base;
   a first probe carried by the base, the probe having a rest position in which it is positioned for electrical contact with an electrical contact on the microelectronic component and the probe being adapted to resiliently return toward the rest position;
   a first actuator means for selectively moving the first probe away from its rest position and away from the electrical contact; and
   a test power means for delivering test-power to the first probe.

22. The probe card of claim 21, wherein the first actuator means is adapted to selectively lift a tip of the first probe above a plane of the first electrical contact.

23. The probe card of claim 21, wherein the first actuator means is adapted to selectively move a tip of the first probe laterally.

24. The probe card of claim 23, wherein the first probe has a rest position, the first actuator means being adapted to move the first probe in a first direction from the rest position and the first probe being adapted to resiliently return toward the rest position.

25. The probe card of claim 23, wherein the first probe has a rest position, the first actuator means being adapted to selectively move the first probe in a first direction from the rest position and to selectively move the first probe in a second direction from the rest position.

26. The probe card of claim 21, wherein the first actuator means comprises a flexor means adapted to change length to move the first probe.

27. The probe card of claim 21, wherein the first actuator means comprises a selectively controllable lift positioned to apply force against an underside of the first probe.

28. The probe card of claim 21, further comprising a second probe carried by the base and a second actuator means for selectively moving the second probe.

29. The probe card of claim 28, wherein the second actuator means is adapted to position the second probe independently of the first probe.

30. The probe card of claim 28, wherein the first and second actuators are adapted to position the first and second probes in unison.

31. A probe card adapted to test a microelectronic component, comprising:

a base;

a first probe carried by the base, the first probe having a first probe tip adapted to deliver test power to a first electrical contact on a microelectronic component;

a second probe having an elongate body and a second probe tip adapted to deliver test power to a second electrical contact on a microelectronic component, the body being attached to the base at a first location and positioning the second probe tip outwardly from the base;

an actuator attached to the body of the second probe and attached to the base at a second location that is spaced from the first location, the actuator being adapted to selectively move the body of the second probe from a first position wherein the second probe tip is positioned in a plane of the first probe tip and a second position wherein the second probe tip is spaced from the plane of the first probe tip.

32. The probe card of claim 32, wherein the second probe is adapted to resiliently return from the second position toward the first position.

33. The probe card of claim 32, wherein the actuator is electrically activated to move the second probe.

34. The probe card of claim 31, wherein the first probe is selectively movable from a first position in which the first probe tip is in contact with the first electrical contact and a second position in which the first probe tip is spaced above a plane of the first electrical contact.

35. The probe card of claim 31, wherein the first probe is selectively movable independently of movement of the second probe.

36. The probe card of claim 31, wherein the first probe is adapted to deliver test power to the first electrical contact only when the second probe is in the second position.

37. The probe card of claim 31, wherein the actuator comprises a flexor that changes length to move the second probe from the first position to the second position.

38. The probe card of claim 37, wherein the flexor is adapted to change length in response to an applied voltage.

39. The probe card of claim 37, wherein the flexor is adapted to change length in response to a temperature change.

40. The probe card of claim 37, further comprising an actuator power circuit electrically coupled to the flexor and adapted to selectively apply actuation power to the flexor to change the length of the flexor.

41. The probe card of claim 31, further comprising a flexor operatively connected to the first probe and to the base, the flexor being adapted to change length by selective heating of the flexor.

42. The probe card of claim 31, further comprising a selectively controllable lift positioned to apply force against an underside of the second probe.

* * * * *